US009231074B2

(12) United States Patent
Camillo-Castillo et al.

(10) Patent No.: US 9,231,074 B2
(45) Date of Patent: Jan. 5, 2016

(54) BIPOLAR JUNCTION TRANSISTORS WITH AN AIR GAP IN THE SHALLOW TRENCH ISOLATION

(71) Applicant: GLOBALFOUNDRIES INC., Grand Cayman (KY)

(72) Inventors: Renata Camillo-Castillo, Essex Junction, VT (US); Vibhor Jain, Essex Junction, VT (US); Vikas K. Kaushal, Essex Junction, VT (US); Marwan H. Khater, Astoria, NY (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 52 days.

(21) Appl. No.: 13/946,379

(22) Filed: Jul. 19, 2013

(65) Prior Publication Data

US 2015/0021738 A1 Jan. 22, 2015

(51) Int. Cl.
*H01L 29/732* (2006.01)
*H01L 29/66* (2006.01)
*H01L 29/737* (2006.01)
*H01L 29/08* (2006.01)
*H01L 29/10* (2006.01)

(52) U.S. Cl.
CPC ...... *H01L 29/66242* (2013.01); *H01L 29/0826* (2013.01); *H01L 29/7378* (2013.01); *H01L 29/1004* (2013.01)

(58) Field of Classification Search
CPC . H01L 29/735; H01L 29/6625; H01L 29/732; H01L 29/7325; H01L 29/66
USPC .......................................... 257/565; 438/353
See application file for complete search history.

(56) References Cited

U.S. PATENT DOCUMENTS

| | | | |
|---|---|---|---|
| 5,098,856 A | 3/1992 | Beyer et al. | |
| 5,789,301 A | 8/1998 | Hill | |
| 6,645,819 B2 | 11/2003 | Pullela | |
| 6,800,518 B2 | 10/2004 | Bendernagel et al. | |
| 6,940,149 B1 | 9/2005 | Divakaruni et al. | |
| 6,964,907 B1 | 11/2005 | Hopper et al. | |
| 7,190,046 B2 | 3/2007 | Akatsu et al. | |
| 7,285,470 B2 | 10/2007 | Bock et al. | |
| 7,396,732 B2 | 7/2008 | Kunnen | |
| 7,816,221 B2 | 10/2010 | John et al. | |
| 2010/0187657 A1* | 7/2010 | Boeck et al. | 257/593 |
| 2011/0057266 A1* | 3/2011 | Wallner et al. | 257/378 |

* cited by examiner

*Primary Examiner* — Kenneth Parker
*Assistant Examiner* — Young W Kim
(74) *Attorney, Agent, or Firm* — Thompson Hine LLP; Anthony J. Canale

(57) ABSTRACT

Device structures, fabrication methods, and design structures for a bipolar junction transistor. A trench isolation region is formed in a substrate. The trench isolation region is coextensive with a collector in the substrate. A base layer is formed on the collector and on a first portion of the trench isolation region. A dielectric layer is formed on the base layer and on a second portion of the trench isolation region peripheral to the base layer. After the dielectric layer is formed, the trench isolation region is at least partially removed to define an air gap beneath the dielectric layer and the base layer.

11 Claims, 5 Drawing Sheets

US 9,231,074 B2

BIPOLAR JUNCTION TRANSISTORS WITH AN AIR GAP IN THE SHALLOW TRENCH ISOLATION

BACKGROUND

The present invention relates generally to semiconductor device fabrication and, in particular, to device structures for a bipolar junction transistor, fabrication methods for a bipolar junction transistor, and design structures for a bipolar junction transistor.

Bipolar junction transistors are typically found in demanding types of integrated circuits, especially integrated circuits destined for high-frequency applications and high-power applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Bipolar junction transistors constitute three-terminal electronic devices constituted by three semiconductor regions, namely an emitter, a base, and a collector. Bipolar junction transistors may be fabricated using a single semiconductor material, such as silicon, with differently doped regions to define the terminals. A heterojunction bipolar junction transistor (HBT) utilizes multiple semiconductor materials for at least two of the terminals and, thereby, takes advantage of the divergent properties (e.g., bandgap) of the different semiconductor materials. An example of such multiple semiconductor materials is silicon germanium in combination with silicon.

An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed that enhance the device performance of bipolar junction transistors.

SUMMARY

In an embodiment of the invention, a method is provided for fabricating a bipolar junction transistor. The method includes forming a trench isolation region in a substrate and coextensive with a collector in the substrate, forming a base layer on the collector and on a first portion of the trench isolation region, and forming a dielectric layer on the base layer and on a second portion of the trench isolation region peripheral to the base layer. The method further includes, after the dielectric layer is formed, at least partially removing the first portion and the second portion of the trench isolation region to define an air gap beneath the dielectric layer and the base layer.

In an embodiment of the invention, a device structure is provided for a bipolar junction transistor. The device structure includes a trench isolation region in a substrate and coextensive with a collector in the substrate, a base layer on the collector and on a first portion of the trench isolation region, and a dielectric layer on the base layer and on a second portion of the trench isolation region peripheral to the base layer. The trench isolation region includes an air gap located beneath the base layer and between the base layer and the collector.

In an embodiment of the invention, a design structure is provided that is readable by a machine used in design, manufacture, or simulation of an integrated circuit. The design structure includes a trench isolation region in a substrate and coextensive with a collector in the substrate, a base layer on the collector and on a first portion of the trench isolation region, and a dielectric layer on the base layer and on a second portion of the trench isolation region peripheral to the base layer. The trench isolation region includes an air gap located beneath the base layer and between the base layer and the collector. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
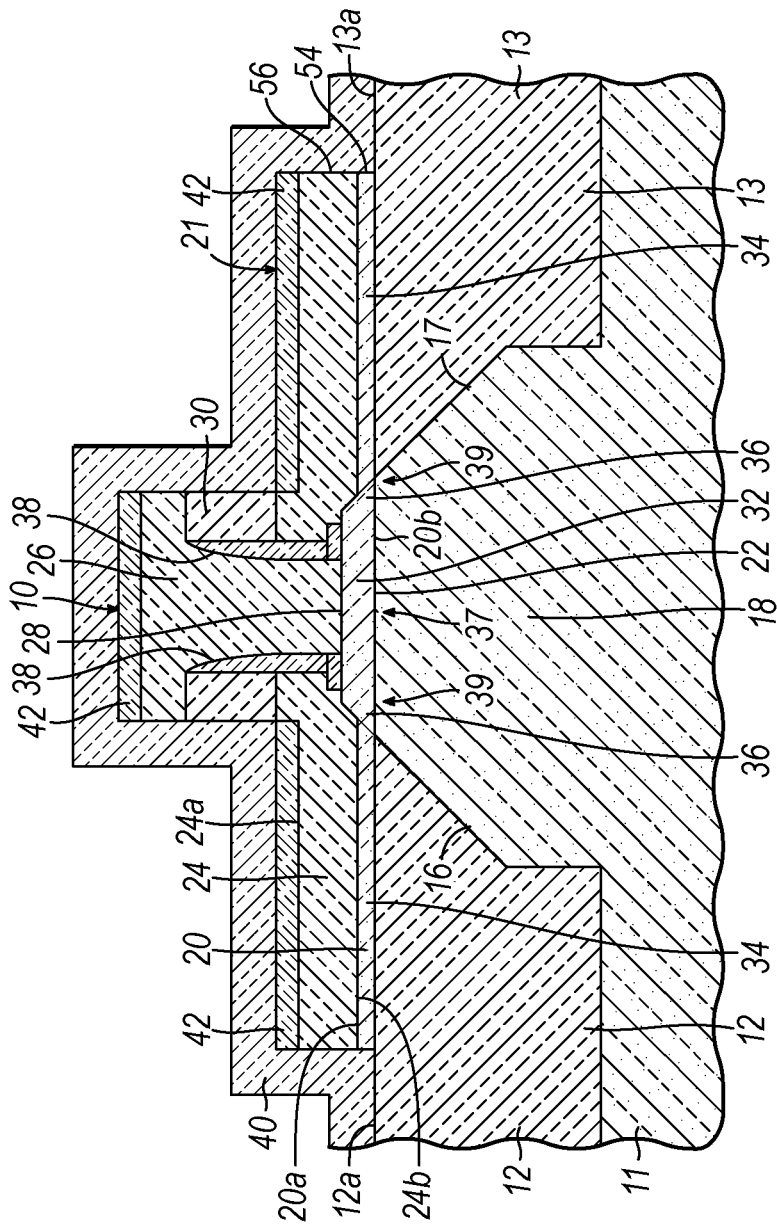
FIGS. 1-3 are cross-sectional views of a portion of a substrate at successive fabrication stages of a processing method for fabricating a device structure in accordance with an embodiment of the invention.

With reference to FIG. 1 and in accordance with an embodiment of the invention, a bipolar junction transistor 10 is formed using a substrate 11, which may be any suitable bulk substrate comprising a semiconductor material that a person having ordinary skill in the art would recognize as suitable for forming an integrated circuit. For example, substrate 11 may be comprised of a wafer of a single crystal silicon-containing material, such as single crystal silicon with a (100) crystal lattice orientation. The semiconductor material comprising substrate 11 may include an epitaxial layer, which may have a different conductivity type than the bulk of the substrate 11.

Trench isolation regions 12, 13 bound and electrically isolate a collector 18 of the bipolar junction transistor 10. The trench isolation regions 12, 13, which have respective top surfaces 12a, 13a, are positioned inside trenches 16, 17. The trench isolation regions 12, 13 may be formed in the substrate 11 by depositing a hardmask, patterning the hardmask and substrate 11 with lithography and etching processes to define the trenches 16, 17, depositing an electrical insulator to fill the trenches 16, 17, planarizing the electrical insulator relative to the hardmask using a chemical mechanical polishing (CMP) process, and removing the hardmask. In one embodiment, the trench isolation regions 12, 13 may be comprised of an oxide of silicon (e.g., silicon dioxide ($SiO_2$)) deposited by low pressure chemical vapor phase deposition (LPCVD).

The trenches 16, 17 may be defined by a wet chemical etching process, a dry etching process, or a combination of wet chemical and dry etching processes. The profile of the trenches 16, 17 may have a specific shape, undercutting angle, undercut distance (i.e., bias), etc. that is chosen by selecting factors such as the chemistry, duration, etc. of the etching process. The etching process may be combined with ion implantation damage to the semiconductor material and/or doping of the semiconductor material to alter etch rates and, thereby, the profile. The etching process may further rely on wafer orientation and anisotropic etching processes that exhibit different etch rates for different crystallographic directions (as specified, for example, by Miller indices) in a single-crystal semiconductor material.

The collector 18, which is positioned interior of the trench isolation regions 12, 13, is constituted by a doped region of semiconductor material of the substrate 11. For example, the collector 18 may comprise an electrically-active impurity species, such as an n-type impurity species from Group V of the Periodic Table (e.g., phosphorus (P) or arsenic (As)) that is effective to impart n-type conductivity in silicon. The collector 18 is comprised of the semiconductor material of substrate 11 and may include an elevated concentration of the electrically-active impurity species in comparison with the initial state of this volume of substrate 11. The collector 18 is coextensive with each of the trench isolation regions 12, 13.

The bipolar junction transistor 10 includes an intrinsic base layer 20, a junction 22 along which the intrinsic base layer 20 is coextensive with the collector 18, and an extrinsic base layer 24 that may be used to establish electrical contact with the intrinsic base layer 20. The intrinsic base layer 20 may include a single crystal section 32 and a non-single crystal section 34 that join along a facet 36. The intrinsic base layer 20 and extrinsic base layer 24 may collectively form a base layer 21 in which a lower surface 24b of extrinsic base layer 24 and a top surface 20a of intrinsic base layer 20 may be coextensive over a majority of the area of these surfaces 20a, 24b. In the representative embodiment, the extrinsic base layer 24 is formed on the top surface 20a of the intrinsic base layer 20 outside of the intrinsic region 37. However, the intrinsic base layer 20 and extrinsic base layer 24 forming the base layer 21 may have a different arrangement with the extrinsic base layer 24 still outside of the intrinsic region 37. For example, the base layer 21 may comprise a single continuous layer in which the extrinsic base layer 24 surrounds the intrinsic base layer 20.

The intrinsic base layer 20 may be comprised of a layer of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of intrinsic base layer 20 may be graded and/or stepped across the thickness of intrinsic base layer 20 or, alternatively, the germanium content of the intrinsic base layer 20 may be uniform. The intrinsic base layer 20 may be doped with an electrically-active impurity species, such as an impurity species from Group III of the Periodic Table (e.g., boron (B) or gallium (Ga)) effective to impart p-type conductivity. The intrinsic base layer 20 may be formed using an epitaxial growth process, such as vapor phase epitaxy (VPE), and may be in situ doped during growth. In an alternative embodiment, the intrinsic base layer 20 may be formed using a selective epitaxial process that does not deposit semiconductor material on the top surfaces 12a, 13a of trench isolation regions 12, 13.

The extrinsic base layer 24 may be comprised of the same material as the intrinsic base layer 20 and may be doped with a concentration of an electrically-active impurity, such as an impurity species selected from Group III of the Periodic Table, and may also be optionally doped with carbon to suppress impurity species out-diffusion. The impurity species doping of the extrinsic base layer 24 may be comparatively greater than the doping of the intrinsic base layer 20 so that the extrinsic base layer 24 exhibits a higher electrical conductivity than the intrinsic base layer 20. The intrinsic base layer 20 and extrinsic base layer 24 may be formed using an epitaxial growth process, such as vapor phase epitaxy, such as VPE, and may be in situ doped during growth.

The bipolar junction transistor 10 includes an emitter 26 that is electrically and physically coupled with the intrinsic base layer 20. The bottom part of the emitter 26 may directly contact the top surface 20a of intrinsic base layer 20 and may be coextensive with the intrinsic base layer 20. A junction 28 of the bipolar junction transistor 10 is defined at the interface between the emitter 26 and the intrinsic base layer 20. The emitter 26 is positioned in an emitter opening, which extends through at least one dielectric layer 30. Dielectric spacers 38 line the emitter opening and surround the emitter 26.

The emitter 26 may be formed from a layer comprised of heavily-doped semiconductor material that is deposited and then patterned using photolithography and etching processes. For example, the emitter 26 may be comprised of polysilicon or polycrystalline silicon-germanium deposited by CVD or LPCVD and heavily doped with a concentration of a dopant, such as an electrically-active impurity species from Group V of the Periodic Table effective to impart n-type conductivity. The emitter opening may be formed using photolithography and etching. Each dielectric layer 30 may be comprised of an electrical insulator or dielectric material, such as $SiO_2$ or $Si_3N_4$ deposited using CVD and patterned after the emitter 26 is defined. The emitter opening may be formed by an etching process, such as RIE, through each dielectric layer 30 to the intrinsic base layer 20. The dielectric spacers 38 may be formed by depositing a conformal layer comprised of an electrical insulator, such as $Si_3N_4$ deposited by CVD, and shaping the conformal layer with an anisotropic etching process, such as RIE. A silicide layer 42 may be formed by standard silicidation on at least the emitter 26 and the extrinsic base layer 24 in preparation for contact formation.

The base layer 21 includes an intrinsic region 37 located beneath the emitter 26 and an extrinsic region 39 peripherally disposed about the intrinsic region 37. The majority of the current flow in the intrinsic base layer 20, which is directly coupled with the emitter 26, may occur primarily through the intrinsic region 37. The extrinsic region 39, which is not directly coupled with the emitter 26, may be used to establish electrical contact with the base layer 21. An inner portion of the single crystal section 32 of intrinsic base layer 20 contributes to forming the intrinsic region 37 of the intrinsic base layer 20. A peripheral portion of the single crystal section 32 and facet 36 of the intrinsic base layer 20 contribute to the extrinsic region 39.

In the representative embodiment, the trench isolation regions 12, 13 are disposed beneath a majority of the lower surface 24b of the extrinsic base layer 24. In an alternative embodiment, the trench isolation regions 12, 13 may be disposed beneath the entirety of the lower surface of the extrinsic base layer 24. In another alternative embodiment, the trench isolation regions 12, 13 may be disposed beneath the entirety of the extrinsic base layer 24 as well as all or a peripheral portion of the extrinsic region 39 of intrinsic base layer 24.

The bipolar junction transistor 10 has a vertical architecture in which the intrinsic base layer 20 is located between the collector 18 and the emitter 26, and the collector 18, the intrinsic base layer 20, and the emitter 26 are vertically arranged. The conductivity types of the semiconductor material constituting the emitter 26 and the semiconductor materials constituting the intrinsic base layer 20 are opposite. The bipolar junction transistor 10 may be characterized as a heterojunction bipolar transistor (HBT) if at least two of the collector 18, intrinsic base layer 20, and emitter 26 are comprised of differing semiconductor materials.

The base layer 21 of the bipolar junction transistor 10 is subjected to a masked etching process that defines an outer edge 54 of the non-single crystal section 34 of intrinsic base layer 20 and an outer edge 56 of the extrinsic base layer 24 at a periphery of the base layer 21. The outer edges 54, 56 terminate the base layer 21 at a location overlying the trench isolation regions 12, 13 such that the base layer 21 is positioned on a portion of each of the trench isolation regions 12, 13. Another portion of each of the trench isolation regions 12, 13 is not covered by the base layer 21.

During the front-end-of-line (FEOL) portion of the fabrication process, the device structure of the bipolar junction transistor 10 is replicated across at least a portion of the surface area of the substrate 11. In BiCMOS integrated circuits, complementary metal-oxide-semiconductor (CMOS) transistors (not shown) may be formed using other regions of the substrate 11. As a result, both bipolar and CMOS transistors may be available on the same substrate 11.

A dielectric layer 40 is applied to the bipolar junction transistor 10. The dielectric layer 40 is positioned on the portion of each of the trench isolation regions 12, 13 that is not covered by the base layer 21 and that is peripheral to the outer edges 54, 56. The dielectric layer 40 is also positioned on the base layer 21 and, more specifically, on the extrinsic base layer 24 overlying the trench isolation regions 12, 13. In addition to covering a majority of the top surface 24a of extrinsic base layer 24, the dielectric layer 40, which is conformal in the representative embodiment, also extends across and over the emitter 26.

In one embodiment, the dielectric layer 40 may be configured to introduce an external source of stress into the construction of the bipolar junction transistor 10. The stress from the dielectric layer 40 is transferred as stress applied to the intrinsic base layer 20 and extrinsic base layer 24, which induces strain in the intrinsic base layer 20 and extrinsic base layer 24 in response to the applied stress. Stress is a measurement of the average internal force per unit area of a surface within the respective bodies comprising the intrinsic base layer 20 and extrinsic base layer 24 in reaction to the external forces received from the dielectric layer 40.

The dielectric layer 40 may be comprised of a dielectric material that is electrically non-conductive and insulating, and the dielectric material may contain either internal compressive stress or internal tensile stress. The magnitude of the tensile stress may range from 0.5 GPa (gigapascals) to 2.5 GPa, and the magnitude of the compressive stress may range from −0.5 GPa to −2.5 GPa. The stress contained in the dielectric layer 40 is stable under post-deposition treatments so that the stress is present when the bipolar junction transistor 10 is under operating conditions in an integrated circuit.

In a representative embodiment, the dielectric material comprising the dielectric layer 40 may be comprised of silicon nitride ($Si_3N_4$) or non-stoichiometric silicon nitride ($Si_xN_y$) that is deposited by a CVD process, such as plasma-enhanced CVD (PEVCD). Alternatively, the dielectric layer 40 may be comprised of a different dielectric material that is susceptible to being deposited with internal compressive or tensile stress. The dielectric layer 40 may have a physical thickness, for example, between 20 nanometers to 50 nanometers.

Deposition conditions, such as substrate temperature, plasma power, and gas flow rates, for the CVD process are controlled to alter the reaction rate within the deposition chamber and to thereby allow control to be exerted over the stress state of the deposited dielectric layer 40. The stress state of the internally-stressed dielectric layer 40 can be controlled by changing the deposition conditions for the CVD process. Specifically, the deposition conditions may be adjusted to incorporate a targeted amount of either compressive stress or tensile stress into the dielectric layer 40. The dielectric layer 40 may be deposited as a blanket layer over the entire surface area of the semiconductor device. A CMP process may be applied to smooth and planarize the electrical insulator of dielectric layer 40 and smooth any topology originating from underlying structures.

Figure 2:
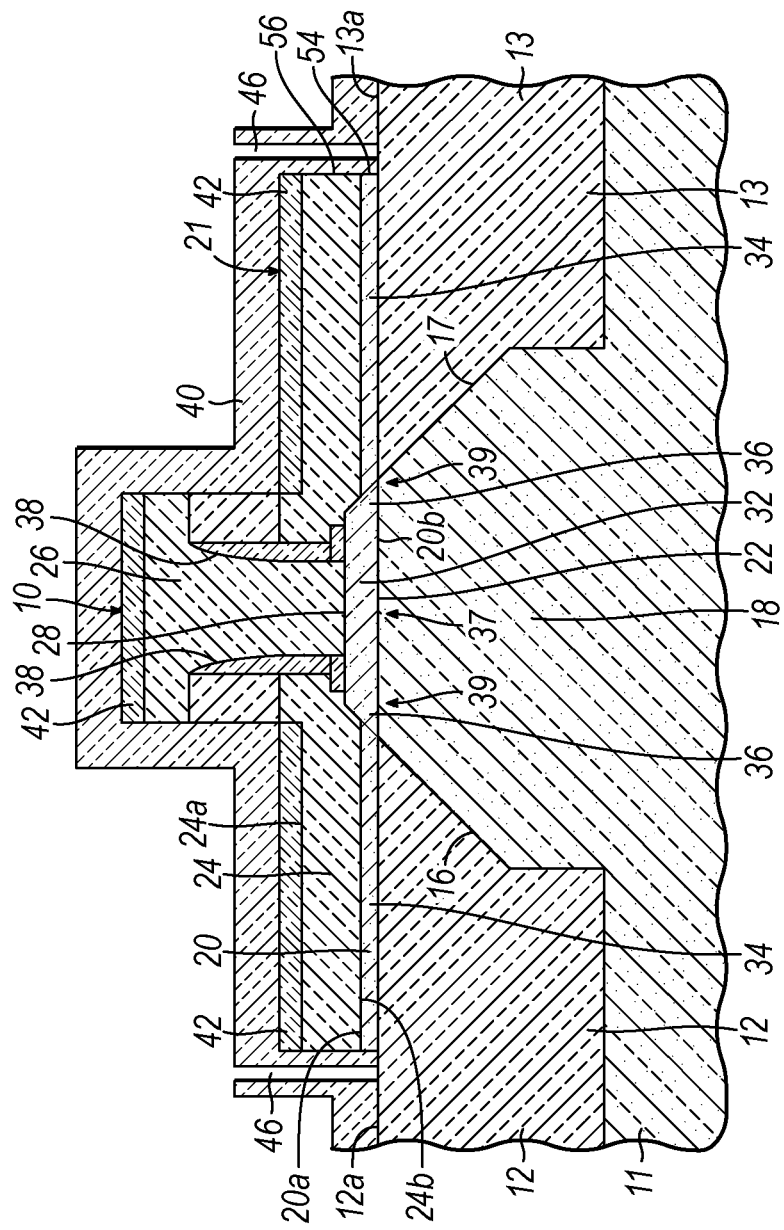

With reference to FIG. 2 in which like reference numerals refer to like features in FIG. 1 and at a subsequent fabrication stage of the processing method, a mask layer is applied to the dielectric layer 40. In one embodiment, the mask layer may be a resist layer comprised of a radiation-sensitive organic material is applied by spin coating, pre-baked, exposed to radiation to impart a latent image of a pattern of openings, baked, and then developed with a chemical developer to define the openings in the resist layer. With the patterned mask layer applied to selectively cover the dielectric layer 40, a wet chemical etching process may be used define a plurality of openings 46 in the dielectric layer 40 with a length that extends through the dielectric layer 40 to the portion of trench isolation regions 12, 13 outside of the footprint of the extrinsic base layer 24. The openings 46 may have a small width (e.g., diameter) of, for example, 40 nanometers and may be characterized as pin holes. The mask layer is subsequently removed by, for example, oxygen plasma ashing or wet chemical stripping.

The base layer 21 is not perforated by the openings 46, which are positioned peripheral to the outer edge 54 of the non-single crystal section 34 of intrinsic base layer 20 and the outer edge 56 of the extrinsic base layer 24. The openings 46 penetrate the dielectric layer 40 peripheral to the outer edges 54, 56 and extend in depth to the top surfaces 12a, 13a of the trench isolation regions 12, 13 at the locations of the respective portions that are not covered by base layer 21.

Figure 3:
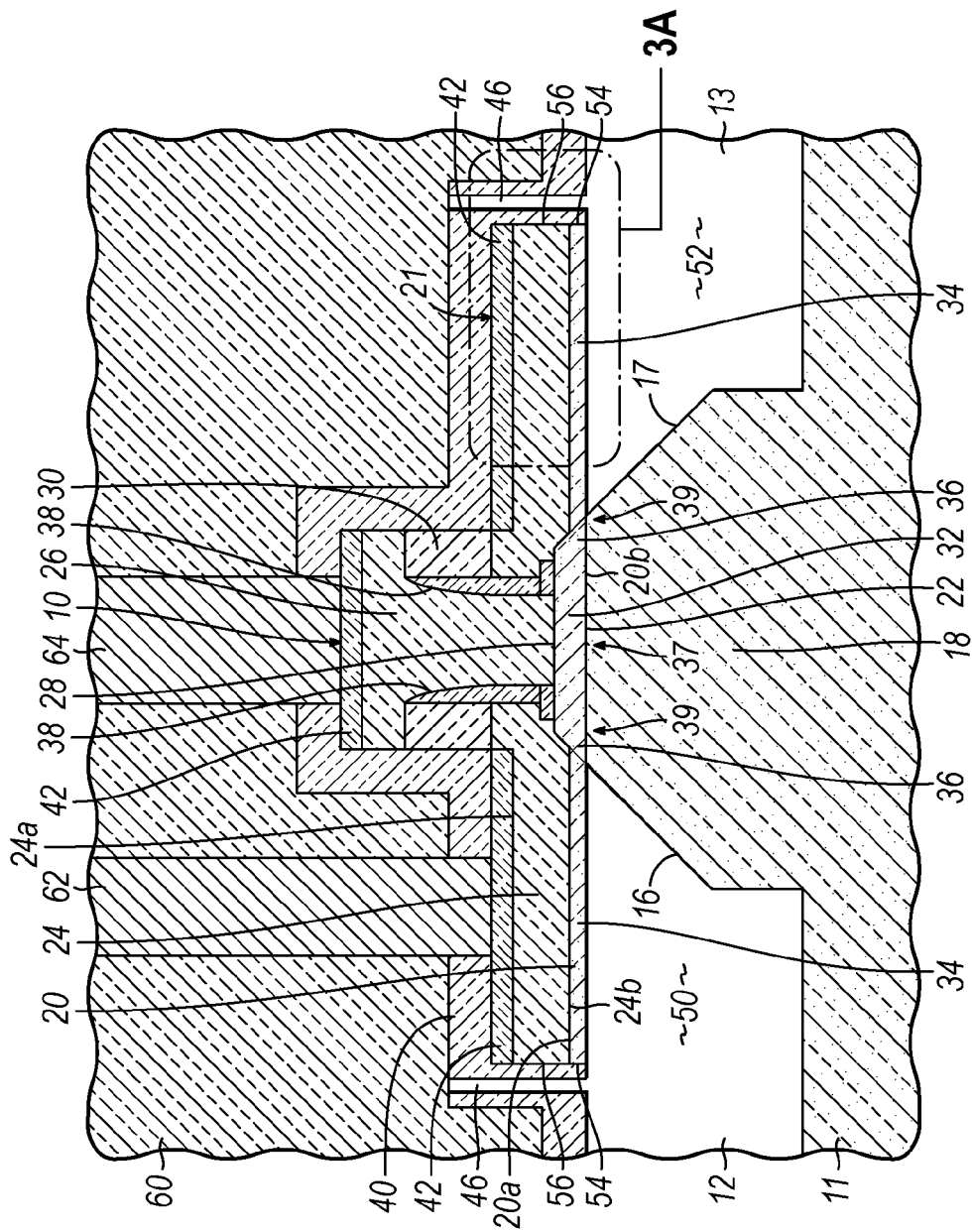
Figure 3A:
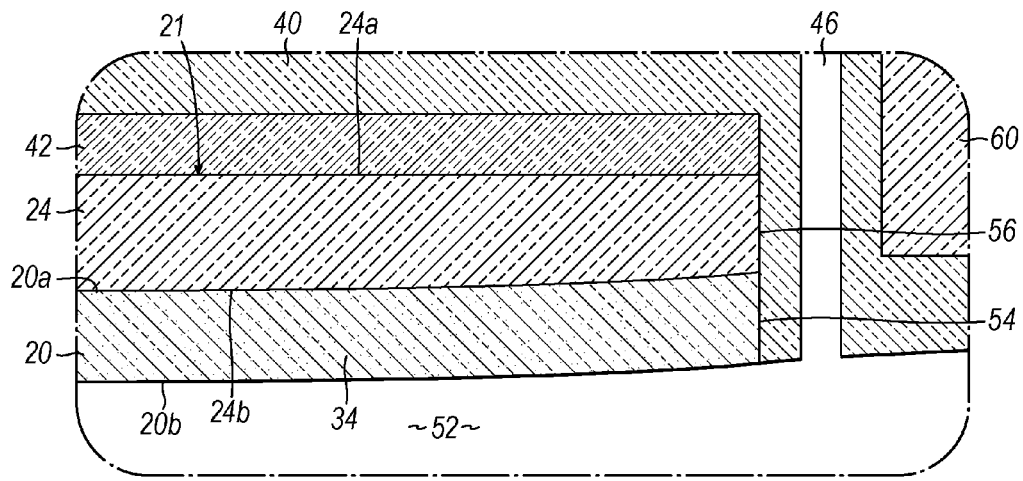
FIG. 3A is an enlarged view of a circled portion of FIG. 3.
Figure 3B:
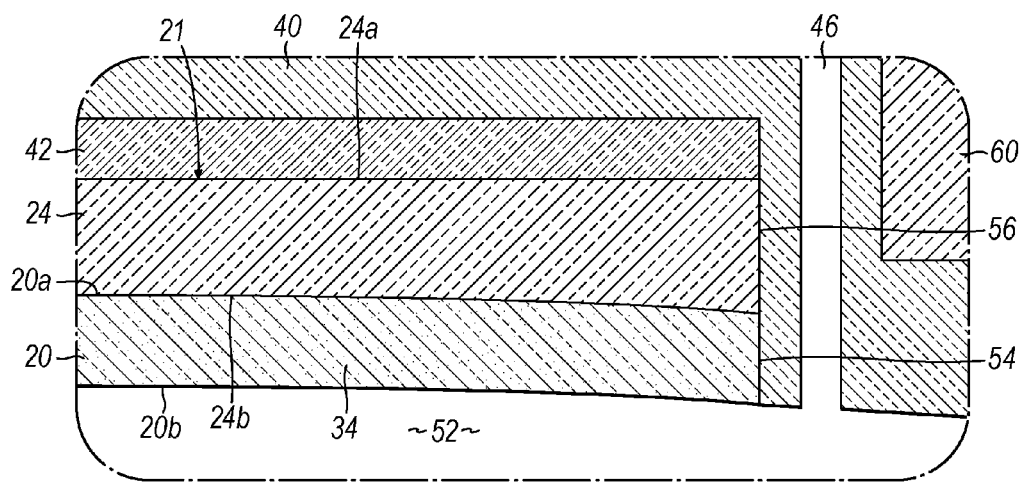
FIG. 3B is an enlarged view similar to FIG. 3A in accordance with an alternative embodiment of the invention.

With reference to FIGS. 3, 3A, 3B in which like reference numerals refer to like features in FIG. 2 and at a subsequent fabrication stage of the processing method, cavities 50, 52 are defined that extend laterally beneath the extrinsic base layer 24. The cavities 50, 52 may have the same shape as the trench isolation regions 12, 13, which are removed to form the cavities 50, 52. The cavities 50, 52 define air gaps that may have an effective dielectric constant of near unity (about 1.0). The cavities 50, 52 may be filled by air at or near atmospheric pressure, filled by another gas at or near atmospheric pressure, or contain air or gas at a sub-atmospheric pressure (e.g., a partial vacuum).

An isotropic etching process, such as a wet chemical etching process, may be applied to at least partially remove the trench isolation regions 12, 13 from beneath the intrinsic base layer 20 and extrinsic base layer 24. In the representative embodiment, the trench isolation regions 12, 13 are completely removed from their respective trenches 16, 17. If the trench isolation regions 12, 13 are comprised of an oxide of silicon, the wet chemical etching process may utilize an etchant comprising buffered hydrofluoric acid (BHF) or diluted hydrofluoric acid (DHF). The etchant accesses the trench isolation regions 12, 13 through the openings 46, and the spent etchant and removed dielectric material are extracted through the openings 46. The etching process removes the dielectric material selective to the semiconductor materials comprising the collector 18, the intrinsic base layer 20, and the extrinsic base layer 24, and to the dielectric material comprising the dielectric layer 40.

As a result of the cavity formation, the non-single crystal section 34 of intrinsic base layer 20 and extrinsic base layer 24 of the base layer 21 are no longer supported from beneath by the trench isolation regions 12, 13 over the extent of the cavities 50, 52. However, the extrinsic base layer 24 is supported from above and at its outer edge 56 by the dielectric layer 40. The non-single crystal section 34 of intrinsic base layer 20 is also supported at its outer edge 54 by the dielectric layer 40.

The dielectric layer 40 may impart mechanical stress in the base layer 21 that induces a strain in the semiconductor material of the extrinsic base layer 24 and/or single crystal section 24 of intrinsic base layer 20. The strain in the dielectric layer 40 relaxes following application, which induces a strain of opposite type in material contacted by the dielectric layer 40. For example, a dielectric layer 40 deposited with tensile strain induces a compressive strain in the intrinsic base layer 20 and/or single crystal section 24 of intrinsic base layer 20.

The magnitude of the mechanical strain experienced by the base layer 21 will change with the presence of the underlying cavities 50, 52. For example, the mechanical stress transferred from the dielectric layer 40 to the base layer 21 may be increased by the presence of the cavities 50, 52. Because of the elimination of the mechanical attachment with the trench isolation regions 12, 13, the non-single crystal section 34 of intrinsic base layer 20 and extrinsic base layer 24 of the base layer 21 are freed to bend as shown in FIGS. 3A, 3B and, in particular, may no longer lie entirely in the same plane as the single crystal section 24 of intrinsic base layer 20.

Strain engineering can be employed to enhance the device performance of the bipolar junction transistor 10. For example, the carrier mobilities in the intrinsic base layer 20 and extrinsic base layer 24 may respond differently to the application of different types and amounts of mechanical stress.

Standard middle-end-of-line (MEOL) and back-end-of-line (BEOL) processing follows, which includes formation of contacts and wiring for the local interconnect structure overlying the bipolar junction transistor 10, and formation of dielectric layers, via plugs, and wiring for an interconnect structure coupled by the interconnect wiring with the bipolar junction transistor 10, as well as other similar contacts for additional device structures like bipolar junction transistor 10 and CMOS transistors (not shown) included in other circuitry fabricated on the substrate 11. Other active and passive circuit elements, such as diodes, resistors, capacitors, varactors, and inductors, may be integrated into the interconnect structure and available for use in the BiCMOS integrated circuit.

As part of the standard MEOL processing, a dielectric layer 60 of a CA level is deposited on the dielectric layer 40. Contacts, such as the representative contacts 62, 64, are formed in the dielectric layer to contact the emitter 26 and extrinsic base layer 24. The dielectric layer 60 is composed of an electrically-insulating dielectric material, such as borophosphosilicate glass (BPSG). The contacts 62, 64 are formed from a conductor, such as a refractory metal like tungsten (W), which can be clad with a conductive liner (e.g., titanium nitride (TiN)). The openings 46 are closed (i.e., occluded) by the dielectric layer 60. Due at least in part to their small size, a conformal oxide is not needed to pinch off the openings 46.

The reduction in the dielectric constant afforded by the cavities 50, 52 beneath the intrinsic/extrinsic base contact area may operate to improve device performance by reducing the collector-to-base parasitic capacitance (Ccb). The unitary dielectric constant of the cavities 50, 52 may provide a lower Ccb in comparison with solid dielectric material filling the trench isolation regions 12, 13. In particular, the cavities 50, 52 may lower the contribution of the extrinsic base layer 24 and the trench isolation regions to the Ccb. The modulation of the parasitic base resistance may be tuned by the tensile strain or compressive strain imparted to base layer 21, which in turn may be used to tune the Ccb.

Figure 4:
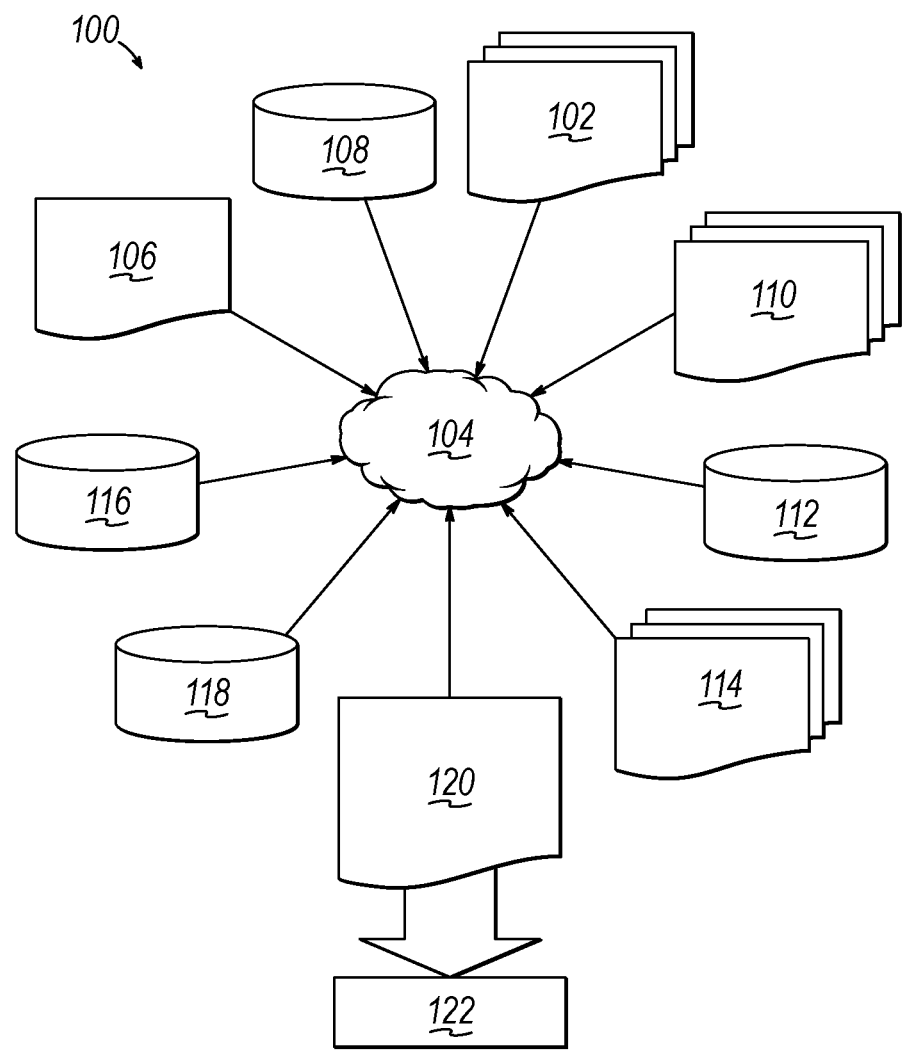
FIG. 4 is a flow diagram of a design process used in semiconductor design, manufacture, and/or test.

FIG. 4 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 3. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 3. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 3 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3. In one embodiment, design structure 120 may comprise a compiled, executable HDL simulation model that functionally simulates the devices shown in FIG. 3.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 3. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
   forming a trench isolation region in a substrate and coextensive with a collector in the substrate;
   forming a base layer on the collector and on a first portion of the trench isolation region;
   forming an emitter on the base layer;
   forming a first dielectric layer on the base layer and on a second portion of the trench isolation region peripheral to the base layer; and
   after the first dielectric layer, the base layer, and the emitter are formed, at least partially removing the first portion and the second portion of the trench isolation region to define an air gap beneath the first dielectric layer and the base layer.

2. The method of claim 1 wherein forming the first dielectric layer on the base layer and on the second portion of the trench isolation region comprises:
   depositing a first dielectric material with tensile stress or compressive stress to form the first dielectric layer,
   wherein the tensile stress or the compressive stress is transferred from the first dielectric layer to the base layer, and the air gap releases the base layer to be strained by the tensile stress or the compressive stress transferred from the stress layer.

3. The method of claim 1 wherein at least partially removing the first portion and the second portion of the trench isolation region to define the air gap beneath the first dielectric layer and the base layer comprises:
   forming a plurality of openings extending through the first dielectric layer to the second portion of the trench isolation region; and
   directing an etchant through the openings to remove the first portion and the second portion of the trench isolation region.

4. The method of claim 3 wherein the etchant is a wet chemical etchant configured to etch a second dielectric material comprising the trench isolation region selective to the first dielectric material comprising the first dielectric layer.

5. The method of claim 3 further comprising:
   after the etchant is directed through the openings to remove the first portion and the second portion of the trench isolation region, forming a second dielectric layer on the first dielectric layer that occludes the openings; and
   forming a contact extending through the second dielectric layer to the base layer.

6. The method of claim 1 wherein forming the base layer on the collector and on the first portion of the trench isolation region comprises:
   forming an intrinsic base layer on at least the collector; and
   forming an extrinsic base layer on the first portion of the trench isolation region.

7. The method of claim 6 wherein the air gap underlies an entirety of a lower surface of the extrinsic base layer.

8. The method of claim 6 wherein the trench isolation region is formed before the intrinsic base layer and the extrinsic base layer are formed, and the trench isolation region is at least partially removed after the intrinsic base layer and the extrinsic base layer are formed.

9. The method of claim 8 wherein the trench isolation region is formed before the emitter is formed.

10. The method of claim 1 wherein the first portion and the second portion of the trench isolation region are completely removed.

11. The method of claim 2 wherein the dielectric material of the first dielectric layer is comprised of silicon nitride.

* * * * *

UNITED STATES PATENT AND TRADEMARK OFFICE
CERTIFICATE OF CORRECTION

PATENT NO.        : 9,231,074 B2
APPLICATION NO.   : 13/946379
DATED             : January 5, 2016
INVENTOR(S)       : Renata Camillo-Castillo et al.

It is certified that error appears in the above-identified patent and that said Letters Patent is hereby corrected as shown below:

Claims

Column 12, line 34, claim 4, after "the" insert --first-- and after "material" delete "of the first dielectric layer"

Signed and Sealed this
Fourteenth Day of June, 2016

Michelle K. Lee
*Director of the United States Patent and Trademark Office*